United States Patent
Watanabe

(10) Patent No.: US 8,120,041 B2
(45) Date of Patent: Feb. 21, 2012

(54) SEMICONDUCTOR LIGHT-EMITTING DEVICE AND METHOD OF MANUFACTURING THE SAME

(75) Inventor: Nobuyuki Watanabe, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 198 days.

(21) Appl. No.: 11/940,846

(22) Filed: Nov. 15, 2007

(65) Prior Publication Data

US 2008/0116471 A1 May 22, 2008

(30) Foreign Application Priority Data

Nov. 17, 2006 (JP) ................................ 2006-311646

(51) Int. Cl.
*H01L 33/00* (2010.01)
(52) U.S. Cl. ............... 257/79; 257/99; 257/E33.001
(58) Field of Classification Search ........... 257/E21.141, 257/79–103, E33.001–E33.077; 438/22–47
See application file for complete search history.

(56) References Cited

U.S. PATENT DOCUMENTS

| | | | |
|---|---|---|---|
| 5,062,115 A * | 10/1991 | Thornton ............... | 372/50.122 |
| 5,132,750 A * | 7/1992 | Kato et al. ............. | 257/96 |
| 5,351,256 A * | 9/1994 | Schneider et al. ...... | 372/45.011 |
| 5,376,580 A | 12/1994 | Kish et al. | |
| 5,403,916 A | 4/1995 | Watanabe et al. | |
| 5,414,281 A | 5/1995 | Watabe et al. | |
| 5,502,316 A | 3/1996 | Kish et al. | |
| 5,661,742 A * | 8/1997 | Huang et al. ............. | 372/46.01 |
| 5,696,389 A * | 12/1997 | Ishikawa et al. ......... | 257/99 |
| 5,793,062 A | 8/1998 | Kish, Jr. et al. | |
| 6,015,719 A | 1/2000 | Kish, Jr. et al. | |
| 6,153,010 A | 11/2000 | Kiyoku et al. | |
| 6,287,882 B1 | 9/2001 | Chang et al. | |
| 6,458,612 B1 | 10/2002 | Chen et al. | |
| 6,462,358 B1 | 10/2002 | Lin et al. | |
| 7,154,123 B2 | 12/2006 | Kunisato et al. | |
| 2003/0015715 A1 | 1/2003 | Sakai | |
| 2004/0106225 A1 | 6/2004 | Hsieh et al. | |
| 2005/0124086 A1 | 6/2005 | Fujiwara | |
| 2005/0199891 A1 | 9/2005 | Kunisato et al. | |
| 2005/0224990 A1* | 10/2005 | Venugopalan ............. | 257/778 |
| 2005/0233504 A1 | 10/2005 | Doi et al. | |
| 2007/0023772 A1 | 2/2007 | Watanabe et al. | |

(Continued)

FOREIGN PATENT DOCUMENTS

CN 1355569 6/2002

(Continued)

OTHER PUBLICATIONS

"Bragg Mirrors" retrieved Jul. 15, 2010 from http://www.rp-photonics.com.*

(Continued)

*Primary Examiner* — Tucker Wright
(74) *Attorney, Agent, or Firm* — Morrison & Foerster LLP

(57) ABSTRACT

A semiconductor light-emitting device has an n-type DBR layer (3), an n-type cladding layer (4), an active layer (5), a p-type cladding layer (6), a p-type intermediate layer (7), a p-type contact layer (8), a p-type transparent substrate (9), ohmic electrodes (10 and 11), and a reflecting layer (12). The n-type DBR layer (3) has reflectivity for the emission wavelength of the active layer (5).

4 Claims, 13 Drawing Sheets

U.S. PATENT DOCUMENTS

2007/0252158 A1   11/2007   Inoguchi

FOREIGN PATENT DOCUMENTS

| | | |
|---|---|---|
| CN | 1159750 C | 7/2004 |
| CN | 1667847 | 9/2005 |
| DE | 102 28 910 | 1/2003 |
| DE | 103 31 825 | 2/2004 |
| JP | 3-230638 | 10/1991 |
| JP | 6-296040 | 10/1994 |
| JP | 9-107123 | 4/1997 |
| JP | 9-237916 | 9/1997 |
| JP | 2720554 | 11/1997 |
| JP | 2000-196139 | 7/2000 |
| JP | 2000-315820 | 11/2000 |
| JP | 3139890 | 12/2000 |
| JP | 3230638 | 9/2001 |
| JP | 3239061 | 10/2001 |
| JP | 3460019 | 8/2003 |
| JP | 3477481 | 12/2003 |
| JP | 2004-146539 | 5/2004 |
| JP | 3532953 | 5/2004 |
| JP | 2004-207508 | 7/2004 |
| JP | 2004-235615 | 8/2004 |
| WO | WO-2004/079700 A1 | 9/2004 |

OTHER PUBLICATIONS

Inoguchi et al., U.S. Office Action mailed Jun. 26, 2009 directed to U.S. Appl. No. 11/790,595; (11 pages).

Watanabe, N. et al., U.S. Office Action mailed on Sep. 30, 2009, directed to a related U.S. Appl. No. 11/492,045; 11 pages.

* cited by examiner

SEMICONDUCTOR LIGHT-EMITTING DEVICE AND METHOD OF MANUFACTURING THE SAME

This nonprovisional application claims priority under 35 U.S.C. §119(a) on Patent Application No. 2006-311646 filed in Japan on Nov. 17, 2006, the entire contents of which are hereby incorporated by reference.

BACKGROUND OF THE INVENTION

The present invention relates to a semiconductor light-emitting device to be used for, for example, a communication device, a road, rail way, or guide display panel device, an advertisement display device, a mobile telephone, a display backlight, lighting equipment, or the like, and a method of manufacturing the semiconductor light-emitting device.

In recent years, technologies of manufacturing a semiconductor light-emitting diode (referred to as an "LED" hereinafter), which is one of semiconductor light-emitting devices, have rapidly progressed, and in particular, LEDs for primary colors of light have been completed after the blue LED was developed, so that it has become possible to produce light of every wavelength by combinations of LEDs for primary colors of light. As a result of this, the scope of application of LEDs has been rapidly widened, and in particular, in the field of lighting, attention is being given to an LED as a natural-light or white-light source which is an alternative to an electric bulb or fluorescent lamp, with the increase of awareness of environmental and energy issues.

However, current LEDs are inferior in efficiency of conversion of applied energy into light as compared with an electric bulb or fluorescent lamp, and therefore research aimed at developing LEDs having a higher conversion efficiency and higher luminance has been underway.

In the past, the focus of the research and development of a higher luminance LED was on epitaxial growth technologies. However, the intracrystalline illumination efficiency (internal quantum efficiency) has been sufficiently improved by the optimization of the band structure such as a multiquantum well structure, meaning that the technologies have matured. Therefore, the approach to an increased luminance of LEDs is being sifted to the development which centers on process technologies.

Increase in luminance by a process technology means increase in external extraction efficiency, and specifically there are process technologies such as technologies for microfabricating LEDs, and forming reflecting films and transparent electrodes, etc. Among others, some techniques of increasing the luminance by wafer bonding have been established for red and blue LEDs, and high luminance LEDs were invented and have appeared on the market.

Techniques of increasing the luminance by wafer bonding are broadly divided into two types.

One is a technique of attaching an opaque substrate such as a silicon substrate or a germanium substrate to an epitaxial layer directly or through a metallic layer. The other one is a technique of attaching a substrate which is pervious to an emission wavelength, such as a glass substrate, a sapphire substrate, or a GaP substrate, to an epitaxial layer directly or through a bonding layer.

The former allows the attached substrate or the metallic layer to function as a reflecting layer to increase the luminous by reflecting light, which is absorbed by a substrate for epitaxial growth in a conventional LED, to the outside before absorbing the light. The latter extracts light to the outside through a transparent substrate to increase the efficiency of extracting light to the outside.

FIG. 1 is a schematic cross-sectional view of a semiconductor light-emitting device in which an example of the former technique is used. In FIG. 1, the reference numeral 101 denotes a silicon substrate, 102 denotes metal for reflection, 103 denotes a luminous layer, 104 and 105 each denote an electrode, and the reference symbol L denotes emitted light.

FIG. 2 is a schematic cross-sectional view of a semiconductor light-emitting device in which an example of the latter technique is used. In FIG. 2, the reference numeral 201 denotes a transparent substrate, 202 denotes a luminous layer, 203 denotes a window layer, 204 and 205 each denote an electrode, and the reference symbol L denotes emitted light.

In particular, the technique of attaching a transparent substrate to an epitaxial layer does not use reflection, so that light emitted by the luminous layer does not pass through the luminous layer again, thereby being not absorbed by the luminous layer. As a result, it is possible to develop an LED which is capable of extracting the emitted light from substantially the whole surface of the device to the outside and has a higher conversion efficiency (light extraction efficiency).

As conventional techniques of attaching a transparent substrate to an epitaxial layer, techniques of attaching a GaP (gallium phosphide) transparent substrate directly to an AlGaInP (aluminum gallium indium phosphide) semiconductor layer which is a 4-element LED structure part are known (see, for example, JP3230638B2, JP3532953B2, and JP3477481B2).

In the case of a technique of attaching a transparent substrate to a semiconductor layer, an electrode is formed on a non-joint surface of the transparent substrate, while the interface between the metal of the electrode and the transparent substrate which are in ohmic contact with each other is generally an alloy layer. The alloy layer absorbs light which has passed through the transparent substrate, so that the larger the area of the electrode, the more the loss of light increases. Furthermore, when the area of the electrode is reduced to reduce the loss of light, the electrical resistance between the electrode and the transparent substrate increases, so that there arises a problem that the driving voltage of the device increases.

A problem similar to the above problem arises also when an opaque substrate such as a silicon substrate is attached to an LED structure part through metal.

When an opaque substrate is attached to an LED structure part through metal, metal for reflection may be formed on the whole of the joint surface of the opaque substrate. However, heat treatment and the like in the joining process makes the metal for reflection react with the metal for electrical connection so that the metals become an alloy layer reducing the reflection factor or become a light absorbing layer.

Thus, any one of the above attaching techniques has a problem that light is absorbed by the electrode or the metal for reflection, and the reflection effect is thus reduced.

SUMMARY OF THE INVENTION

It is therefore an object of the present invention to provide a semiconductor light-emitting device having an increased light-extraction efficiency, and a method of manufacturing it.

The present invention provides a semiconductor light-emitting device, including:
a first conductivity type first semiconductor layer;
a luminous layer formed on the first semiconductor layer;

a second conductivity type second semiconductor layer formed on the luminous layer; and a first reflecting layer which is formed under the first semiconductor layer and composed of stacked two or more first conductivity type semiconductor layers, and at least part of which has reflectivity for an emission wavelength of the luminous layer.

In this specification, the "first conductivity type" means a p-type or an n-type, and the "second conductivity type means" the n-type when the first conductivity type is p-type, and means the p-type when the first conductivity type is n-type.

In the semiconductor light-emitting device of this configuration, when an electrode for reflecting layer use, for example, is formed under the first reflecting layer, light emitted by the luminous layer is reflected by the first reflecting layer before being absorbed by the electrode for reflecting layer use, so that the light extraction efficiency is prevented from reducing.

Thus, the light extraction efficiency of the semiconductor light-emitting device can be increased. The effect of increasing the light extraction efficiency can be increased by optimizing the arrangement of the first reflecting layer and the electrode for reflecting layer use formed under the first reflecting layer.

In one embodiment, the semiconductor light-emitting device further has a transmissive substrate which is mounted on the second semiconductor layer and is pervious to the emission wavelength of the luminous layer.

In the semiconductor light-emitting device of this embodiment, the transmissive substrate which is pervious to the emission wavelength of the luminous layer is mounted on the second semiconductor layer, so that light emitted by the luminous layer can be extracted efficiently from the transmissive substrate.

Furthermore, when an electrode is formed on a surface of the transmissive substrate opposite from the second semiconductor layer side surface, the amount of light incident on the electrode can be reduced provided that the electrode is shaped like an electrode for reflecting layer use 504 shown in FIG. 6B.

When the electrode is formed as the electrode for reflecting layer use 504 shown in FIG. 6B, the electrical resistance between the electrode for reflecting layer use 504 and the transmissive substrate can also be prevented from increasing.

Furthermore, since the transmissive substrate is mounted on the second semiconductor layer, the distance between the luminous layer and a die bond surface on which the semiconductor light-emitting device is die bonded can be small.

Thus, heat generated near the luminous layer is radiated or discharged efficiently to the die bond surface, and thereby the reliability of the semiconductor light-emitting device can be increased.

In one embodiment, the transmissive substrate is composed of a second conductivity type semiconductor layer, an electrode for transmissive substrate use is formed on the transmissive substrate, and an electrode for reflecting layer use is formed underneath the first reflecting layer.

In the semiconductor light-emitting device of this embodiment, light emitted by the luminous layer is reflected by the first reflecting layer before absorbed by the electrode for reflecting layer use, so that the light extraction efficiency is prevented from reducing.

Furthermore, if the electrode for reflecting layer use is formed on the whole of a surface of the first reflecting layer opposite from the first semiconductor layer, heat generated near the luminous layer is discharged efficiently to the outside through the electrode for reflecting layer use, and thereby the reliability of the semiconductor light-emitting device can be increased.

In one embodiment, an electrode for reflecting layer use is formed on part of a surface of the first reflecting layer opposite from the first semiconductor layer.

In one embodiment, a second reflecting layer which has reflectivity for the emission wavelength of the luminous layer is formed on the surface of the first reflecting layer opposite from the first semiconductor layer, in an area other than an area where the electrode for reflecting layer use is formed.

In one embodiment, the second reflecting layer is formed so as to cover the first reflecting layer and the electrode for reflecting layer use.

In one embodiment, the second reflecting layer is composed of one or more layers made of at least one or more elements of Au, Ag, Al, Ti, Cu, Mo, Sn, W, Ta, Pt, Ge, Si, Zn, Be, Cr, Se, and Ni.

In the semiconductor light-emitting device of this embodiment, when an Au layer, an Mo layer, and an AuSn layer, for example, are stacked in this order on a relevant crystal face of the first reflecting layer, light which has passed through the first reflecting layer is reflected by the Au layer.

Furthermore, one surface of the AuSn layer serves as a die bond surface for fixing the semiconductor light-emitting device, so that eutectic bonding by AuSn can be applied.

As a matter of course, also when all of the Au layer, Mo layer, and AuSn layer is not stacked, but only the Au layer is stacked, in other words, an Au single layer is provided, sufficient electrical conductivity and reflectivity can be ensured.

For a usual semiconductor light-emitting device, die bonding is performed with a pasty material such as silver paste or solder. At the die bonding, however, the pasty material can creep up the side of the device and reach the side of the luminous layer.

When the pasty material has reached the side of the luminous layer, the pasty material may form a current path so that current leak arises.

By taking advantage of the eutectic of AuSn, the problem of current leak as described above is solved. However, formation of the eutectic requires heating at hundreds of degrees centigrade, so that when, for example, an Au layer and an AuSn layer are stacked in this order on the crystal face of the first reflecting layer, the Au layer and the AuSn layer which have reflectivity will be disadvantageously alloyed with each other and function as a light-absorbing layer.

In order to avoid this alloying, it is sufficient to provide a Mo layer between the Au layer and the AuSn layer. Mo is not alloyed with Au or AuSn material, thus functioning as a layer for blocking the alloying.

Alternatively, an Au layer, a W layer, and an AuSn layer may be stacked in this order on the crystal face of the first reflecting layer. Alternatively, an Al layer, a Ti layer, and an AuSi layer may be stacked in this order on the crystal face of the first reflecting layer. Alternatively, an Ag layer, a Ti layer, and an AuGe layer may be stacked in this order on the crystal face of the first reflecting layer. Alternatively an Ag layer, a Ti layer, a Mo layer, and an AuSi layer may be stacked in this order on the crystal face of the first reflecting layer. However, there is no limit to the number of layers and materials, and materials most suitable for the emission wavelength and the crystal material may be selected as appropriate, provided that any combination of Au, Ag, Al, Ti, Cu, Mo, Sn, W, Ta, Pt, Ge, Si, Zn, Be, Cr, Se, and Ni is used.

In one embodiment, the transmissive substrate comprises a semiconductor layer including at least two or more elements of Ga, Si, P, C, Zn, Se, Cd, Te, B, N, Al, In, Hg, S, and O.

In the semiconductor light-emitting device of this embodiment, because the semiconductor layer constituting the transmissive substrate includes at least two or more elements of Ga, Si, P, C, Zn, Se, Cd, Te, B, N, Al, In, Hg, S, and O, the substrate is able to have electrical conductivity and is also pervious to the emission wavelength of the luminous layer.

As the material of the transmissive substrate, material which is pervious to the emission wavelength of the light-emitting device, in other words, has a broad band gap, such as GaP, SiC, ZnSe, ZnTe, or the like may be selected.

In one embodiment, the semiconductor light-emitting device further includes a supporting substrate placed underneath the first reflecting layer.

In one embodiment, the supporting substrate is joined to the first reflecting layer through a metal.

In one embodiment, the metal is composed of a metal for ensuring electrical conductivity of a joint between the supporting substrate and the first reflecting layer, and a metal for ensuring the reflectivity for the emission wavelength of the luminous layer.

In one embodiment, the metal is composed of one or more layers made of at least one or more elements of Au, Ag, Al, Ti, Cu, Mo, Sn, W, Ta, Pt, Ge, Si, Zn, Be, Cr, Se, and Ni.

In the semiconductor light-emitting device of this embodiment, because the metal is composed of one or more layers made of at least one or more elements of Au, Ag, Al, Ti, Cu, Mo, Sn, W, Ta, Pt, Ge, Si, Zn, Be, Cr, Se, and Ni, the metal can provide an AuSi alloy layer for electrical joint and an Au layer as an example of the metallic reflecting layer, for example.

There is a sufficient distance between the luminous layer and the die bond surface due to the supporting substrate, so that it is not necessary to take countermeasures such as use of eutectic joint or the like to prevent current leak. Also, provided that a substrate of high thermal conductivity is selected as the supporting substrate, there will not arise a problem regarding the heat radiation or dissipation.

In one embodiment, the supporting substrate is made of material including at least one or more elements of Au, Ag, Al, Ti, Cu, Mo, Sn, W, Ta, Pt, Ge, Si, Ga, Zn, Be, Cr, Se, and Ni.

In the semiconductor light-emitting device of this embodiment, because the supporting substrate is made of material including at least one or more elements of Au, Ag, Al, Ti, Cu, Mo, Sn, W, Ta, Pt, Ge, Si, Ga, Zn, Be, Cr, Se, and Ni, the supporting substrate makes an electrically conductive substrate.

For example, a single metallic substrate of Ag, Al, Mo, or the like, an electrically conductive supporting substrate made of AuAg alloy, TiW alloy, or the like, or an electrically conductive supporting substrate having a metallic multi-layer structure can be obtained.

Furthermore, an electrically conductive supporting substrate made of semiconductor such as AlGaAs, GaP, or SiC can be obtained.

The present invention also provides a method of manufacturing the semiconductor light-emitting device according to one embodiment, including:

a stacking process of stacking the first reflecting layer, the first semiconductor layer, the luminous layer, and the second semiconductor layer on a substrate;

a substrate mounting process of mounting the transmissive substrate directly or indirectly on the second semiconductor layer after the stacking process;

a substrate removing process of removing the substrate to expose a surface of the first reflecting layer opposite from the first semiconductor layer after the substrate mounting process; and an electrode forming process of forming an electrode on part or the whole of the surface of the first reflecting layer opposite from the first semiconductor layer after the substrate removing process.

Furthermore, the present invention provides a method of manufacturing the semiconductor light-emitting device of another embodiment, including:

a stacking process of stacking the second semiconductor layer, the luminous layer, the first semiconductor, and the first reflecting layer on a substrate;

a substrate mounting process of mounting the supporting substrate directly or indirectly on a surface of the first reflecting layer opposite from the first semiconductor layer after the stacking process;

a substrate removing process of removing the substrate to expose a surface of the second semiconductor layer opposite from the luminous layer after the substrate mounting process; and an electrode forming process of forming an electrode on the whole or part of a surface of the supporting substrate opposite from the first reflecting layer, and an electrode on the whole or part of the surface of the second semiconductor layer opposite from the luminous layer, after the substrate removing process.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

The semiconductor light-emitting device of the present invention will be described in detail below with reference to the embodiments shown in the figures.

As is apparent from the above description, the semiconductor light-emitting device of the present invention basically has a first conductivity type fist semiconductor layer, a luminous layer formed on the first semiconductor layer, a second conductivity type second semiconductor layer formed on the luminous layer, and a first reflecting layer which is formed under the first semiconductor layer and composed of stacked two or more first conductivity type semiconductor layers, and at least part of which has reflectivity for an emission wavelength of the luminous layer. And, the semiconductor light-emitting device of the present invention may also have various additional features, as described below.

Figure 1:
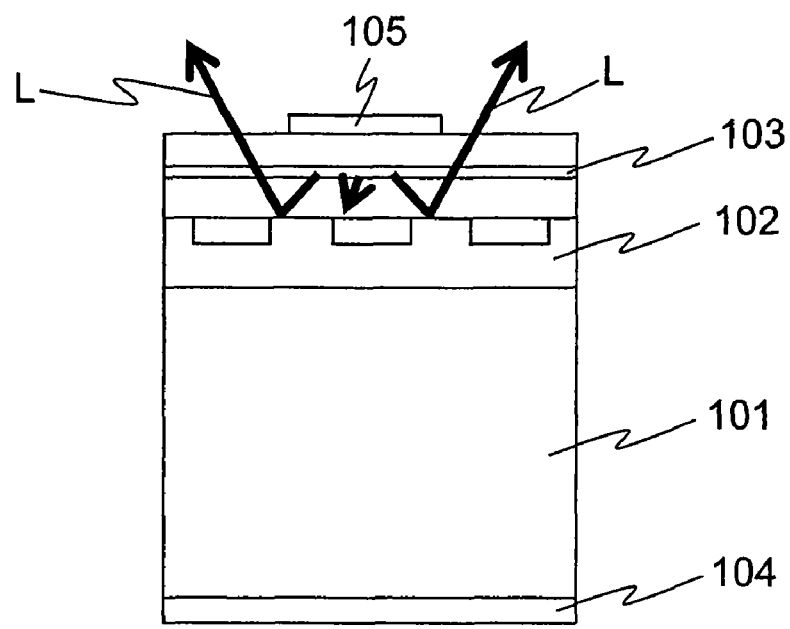
FIG. 1 is a schematic cross-sectional view of a conventional light-emitting device.
Figure 2:
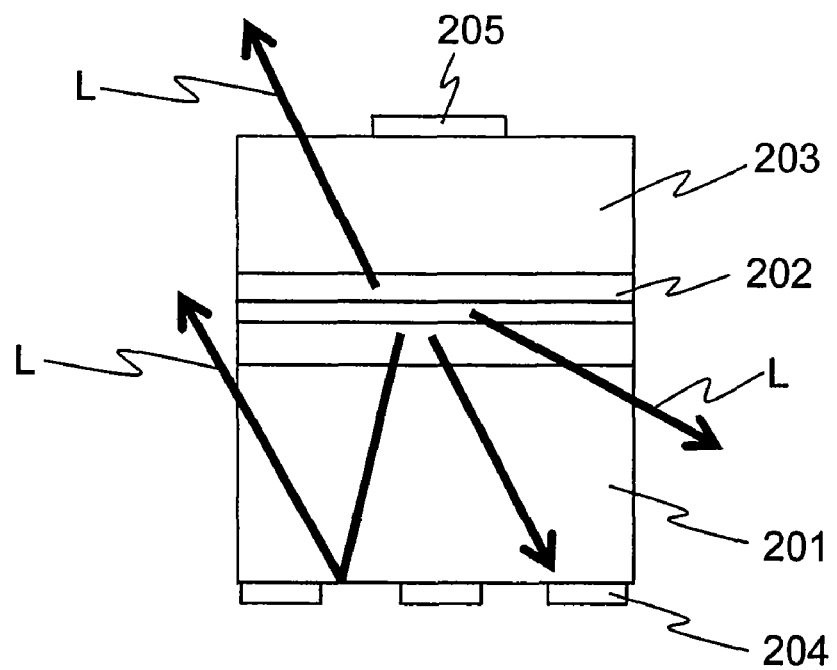
FIG. 2 is a schematic cross-sectional view of another conventional light-emitting device.
Figure 3:
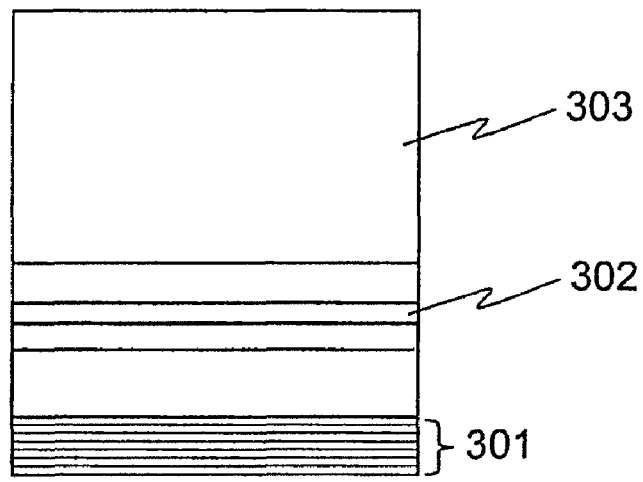
FIG. 3 is a schematic cross-sectional view of a light-emitting device according to an embodiment of the present invention.

FIG. 3 is a schematic cross-sectional view of an example of a semiconductor light-emitting device having a transmissive substrate which is pervious to the emission wavelength of the luminous layer. In FIG. 3, the reference numeral 301 denotes a distributed Bragg reflector (DBR) layer as an example of the first reflecting layer, 302 denotes a luminous layer, and 303 denotes a transmissive substrate.

The n-type DBR layer 301 is composed of two or more semiconductor epitaxial layers. Furthermore, layers between the n-type DBR layer 301 and the luminous layer 302 and layers between the luminous layer 302 and the transmissive substrate 303 are also composed of semiconductor epitaxial layers.

Figure 4:
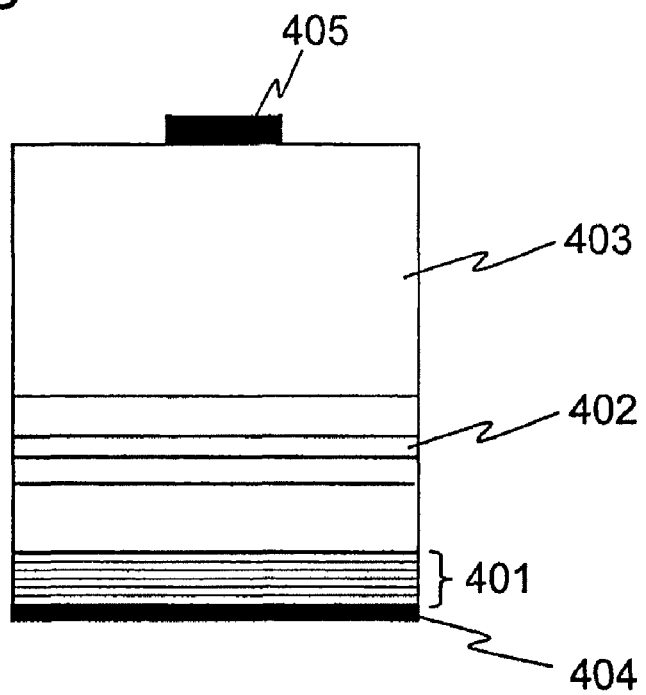
FIG. 4 is a schematic cross-sectional view of a light-emitting device according to an embodiment of the present invention.

FIG. 4 is a schematic cross-sectional view showing an example of a semiconductor light-emitting device having an electrode for transmissive substrate use formed on the transmissive substrate, and an electrode for reflecting layer use formed on the under surface of the first reflecting layer. In FIG. 4, the reference numeral 401 denotes a DBR layer as an example of the first reflecting layer, 402 denotes a luminous layer, 403 denotes the transmissive substrate, 404 denotes the electrode for reflecting layer use, and 405 denotes the electrode for transmissive substrate use.

The DBR layer 401 is composed of tow or more semiconductor epitaxial layers. Furthermore, layers between the DBR layer 401 and the luminous layer 402 and layers between the luminous layer 402 and the transmissive substrate 403 are also composed of semiconductor epitaxial layers.

Figure 5:
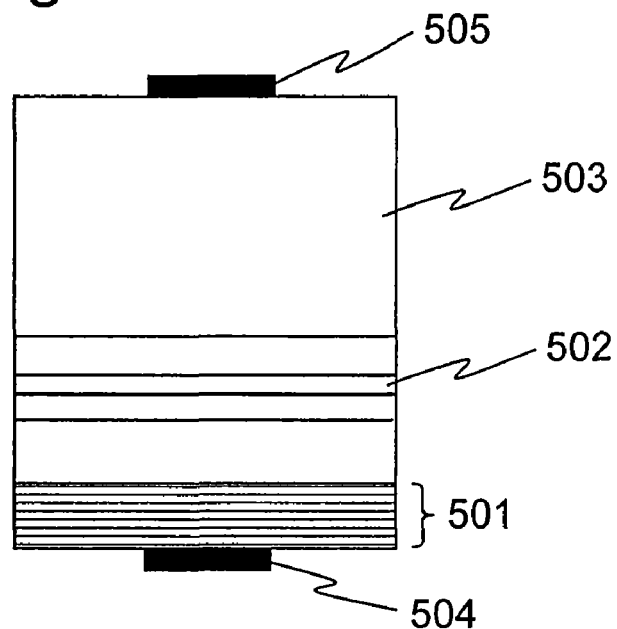
FIG. 5 is a schematic cross-sectional view of a light-emitting device according to an embodiment of the present invention.

FIG. 5 is a schematic cross-sectional view of an example of a semiconductor light-emitting device having an electrode for reflecting layer use formed on part of a surface of the first reflecting layer opposite from the first semiconductor layer. In FIG. 5, the reference numeral 501 denotes a DBR layer as an example of the first reflecting layer, 502 denotes a luminous layer, 503 denotes a transmissive substrate, 504 denotes the electrode for reflecting layer use, and 505 denotes an electrode for transmissive substrate use.

The DBR layer 501 is composed of two or more semiconductor epitaxial layers. Furthermore, the electrode for reflecting layer use 504 is formed on part of a surface of the DBR layer 501 opposite from the luminous layer. In other words, only part of the surface is covered with the electrode for reflecting layer use 504.

In general, the DBR layer 501 is very effective in reflecting light vertically incident on the DBR layer 501.

However, the DBR layer 501 does not have the reflection factor of 100%, and is pervious to part of the incident light.

Furthermore, the DBR layer 501 is almost ineffective in reflecting light obliquely incident on the DBR layer 501, i.e., light other than light vertically incident on the DBR layer 501.

Figure 6A:
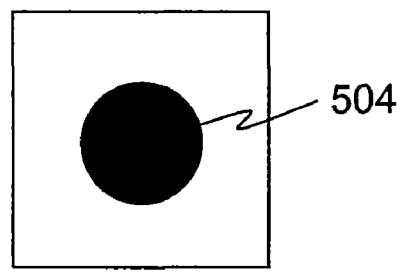
FIG. 6A shows the shape of an electrode for reflecting layer use in the light-emitting device shown in FIG. 5.

Thus, in order to achieve a larger reflection effect which reduces the amount of absorbed light, it is preferred that the area of the electrode for reflecting layer use 504 is smaller, so that it is desirable that the electrode for reflecting layer use 504 is shaped like a dot as shown in FIG. 6A.

Figure 6B:
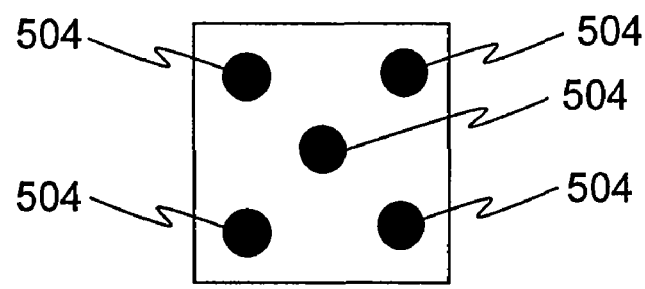
FIG. 6B shows the shape of an electrode for reflecting layer use in the light-emitting device shown in FIG. 5.

However, as described above, when the area of the electrode is reduced, the resistance of it increases accordingly. Therefore, in order to expand the area through which an electric current flows, it is desirable that the electrode for reflecting layer use 504 is shaped like dots as shown in FIG. 6B.

For example, when the electrode for reflecting layer use 504 is formed on only the center part of the device as shown in FIG. 6A, only the center part of the luminous layer 502 emits light because the position of the electrode for reflecting layer use 504 is about the same as the luminous position of the luminous layer 504, so that light emitted from the luminous layer 502 to the electrode for reflecting layer use 504 is reflected by the DBR layer 501. On the other hand, some components of light emitted from the luminous layer 502 in a direction different from the direction of the electrode 504 are reflected by the DBR layer 501, and the remaining light components are once released out of the crystal and then reflected by, for example, silver paste used for supporting the device, or the frame material.

Furthermore, when the electrode for reflecting layer use is formed over the entire surface of the DBR layer 501 opposite from the luminous layer 502, the electric current spreads to the whole of the device.

For this reason, the luminous area of the luminous layer 502 also expands. However, light components obliquely incident on the first reflecting layer also increase, so that light components absorbed by the electrode also increase accordingly. As a result, an effect of outputting more light more efficiently cannot be expected.

Figure 7:
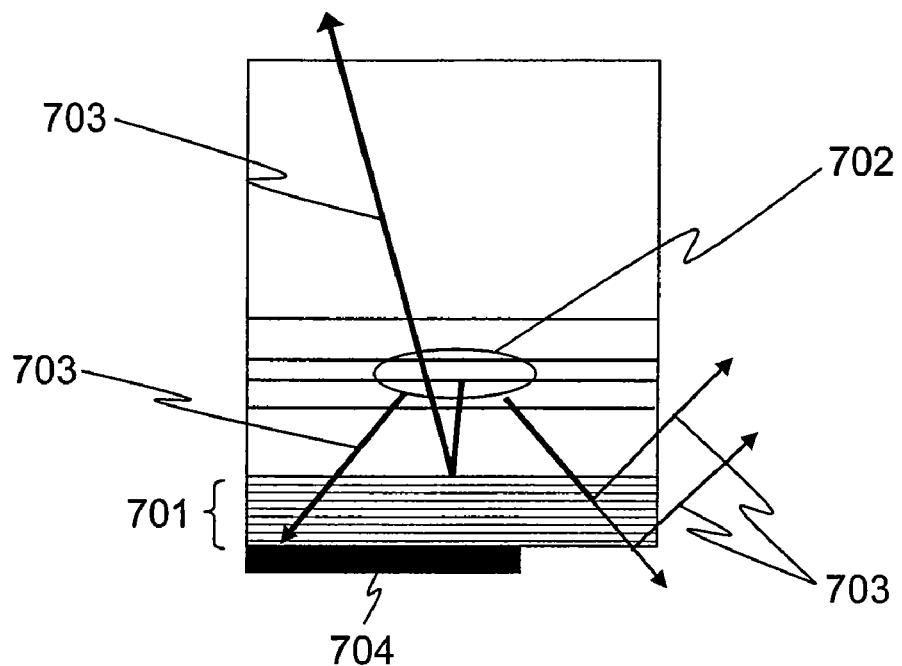
FIG. 7 shows the manner of reflection of a DBR layer in the light-emitting device shown in FIG. 5.

FIG. 7 shows the manner of reflection of the DBR layer 701. In FIG. 7, the numeral 702 denotes a luminous area, 703 denotes loci of emitted light, and 704 denotes an electrode for reflecting layer use.

As can be understood from the figure, in order to make the expansion of the luminous area compatible with the increase of the reflection effect, it is preferred that the electrode for reflecting layer use is shaped like dots, which are arranged evenly on the opposite side of the first reflecting layer from the first semiconductor layer.

Furthermore, the electrode for reflecting layer use may be made into a given shape.

Figure 8:
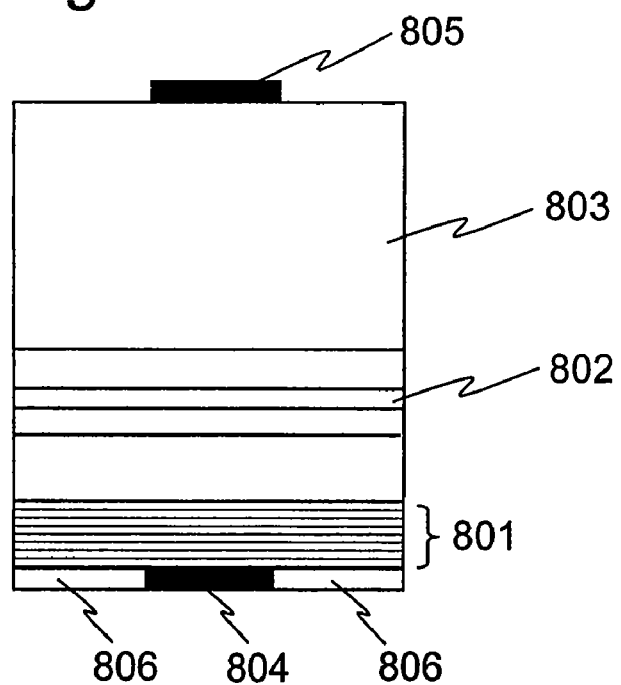
FIG. 8 is a schematic cross-sectional view of a light-emitting device according to an embodiment of the present invention.

FIG. 8 is a schematic cross-sectional view of a semiconductor light-emitting device in which a second reflecting layer capable of reflecting the emission wavelength of the luminous layer is formed on the surface of the first reflecting layer opposite from the first semiconductor layer in an area other than an area in which the electrode for reflecting layer use is formed. In FIG. 8, the reference numeral 801 denotes a DBR layer as an example of the first reflecting layer, 802 denotes a luminous layer, 803 denotes a transmissive substrate, 804 denotes the electrode for reflecting layer use, 805 denotes an electrode for transmissive substrate use, and 806 denotes a reflecting metal as an example of the second reflecting layer.

The DBR layer 801 is composed of two or more semiconductor epitaxial layers. A surface of the electrode for reflecting layer use 804 opposite from the DBR layer 801 is not covered with the reflecting metal 806 but is exposed. In more detail, the surface of the electrode for reflecting layer use 804 opposite from the DBR layer 801 is substantially flush with a surface of the reflecting metal 806 opposite from the DBR layer 801.

As described above, the DBR layer 801 has a little effect in reflecting light obliquely incident on it.

In order to surely reflect such light, it is preferred to provide a metallic reflecting layer such as the reflecting metal 806, and when the electrode for reflecting layer use 804 and the reflecting metal 806 are arranged alternately as shown in FIG. 8, a larger effect of reflecting light can be obtained.

Figure 9:
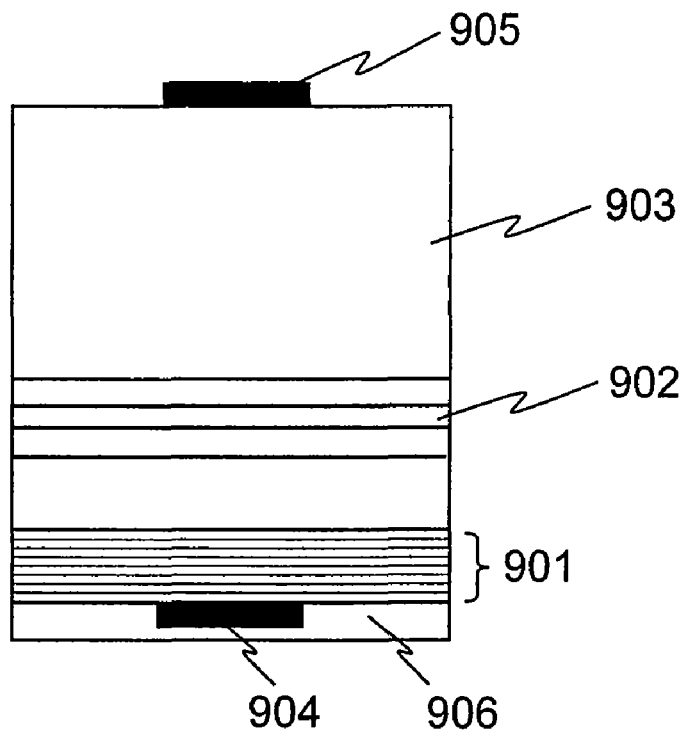
FIG. 9 is a schematic cross-sectional view of a light-emitting device according to an embodiment of the present invention.

FIG. 9 is a schematic cross-sectional view of an example of a semiconductor light-emitting device in which the second reflecting layer is formed so as to cover both the first reflecting layer and the electrode for reflecting layer use. In FIG. 9, the reference numeral 901 denotes a DBR layer as an example of the first reflecting layer, 902 denotes a luminous layer, 903 denotes a transmissive substrate, 904 denotes an electrode for reflecting layer use, 905 denotes an electrode for transmissive substrate use, and 906 denotes a reflecting metal as an example of the second reflecting layer.

The DBR layer 901 is composed of two or more semiconductor epitaxial layers. Furthermore, a surface of the electrode for reflecting layer use 904 opposite from the DBR layer 901 is covered with the reflecting metal 906 and is not exposed. In other words, the reflecting metal 906 is formed underneath the DBR layer 901 and the electrode for reflecting layer use 904.

The reflecting metal 906 covers the DBR layer 901 and the whole of a surface opposite from the DBR layer 901 of the electrode for reflecting layer use 904, so that a larger effect of reflecting light can be obtained. In addition, the process of shaping and patterning the reflecting metal 906 is not required, which contributes to the simplification and facilitation of the manufacturing process.

Figure 10:
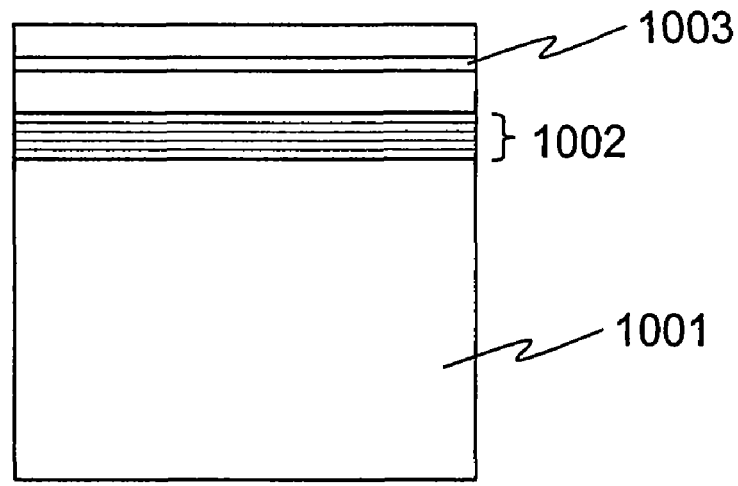
FIG. 10 is a schematic cross-sectional view of a light-emitting device according to an embodiment of the present invention.

FIG. 10 is a schematic cross-sectional view of an example of a semiconductor light-emitting device having a supporting substrate mounted under the first reflecting layer. In FIG. 10, the reference numeral 1001 denotes the supporting substrate, 1002 denotes a DBR layer, and 1003 denotes a luminous layer.

The DBR layer 1002 is composed of two or more semiconductor epitaxial layers. Furthermore, layers between the DBR layer 1002 and the luminous layer 1003 and on the luminous layer 1003 are also composed of semiconductor epitaxial layers.

After two or more semiconductor epitaxial layers are stacked, the DBR layer 1002 is stacked on the surface of the semiconductor epitaxial layers, and then the supporting substrate 1001 is mounted on the surface of the DBR layer 1002. The supporting substrate 1001 is joined directly or indirectly to the DBR layer 1002. In other words, there may be an additional layer or no layers between the supporting substrate 1002 and the DBR layer 1002.

Light emitted by the luminous layer 1003 is reflected by the DBR layer 1002 and extracted to the outside.

Thus, the supporting substrate 1001 does not need to be transmissive, and is mounted to support the semiconductor laminated structure including the luminous layer 1003.

Although the supporting substrate 1001 can be joined to the DBR layer 1002 directly or indirectly through metal or the like, heat treatment is required in either case, and an alloy layer or a light-absorbing layer is formed at the joint interface during the heat treatment.

Even if the light-absorbing layer is formed at the joint interface between the supporting substrate and the DBR layer, the DBR layer 1002 is located between the supporting substrate 1001 and the luminous layer 1003, so that light emitted by the luminous layer 1003 is reflected by the DBR layer 1002 before reaching the light-absorbing layer.

Thus, the loss of light that may be caused by light absorption of the light-absorbing layer is little.

Figure 11:
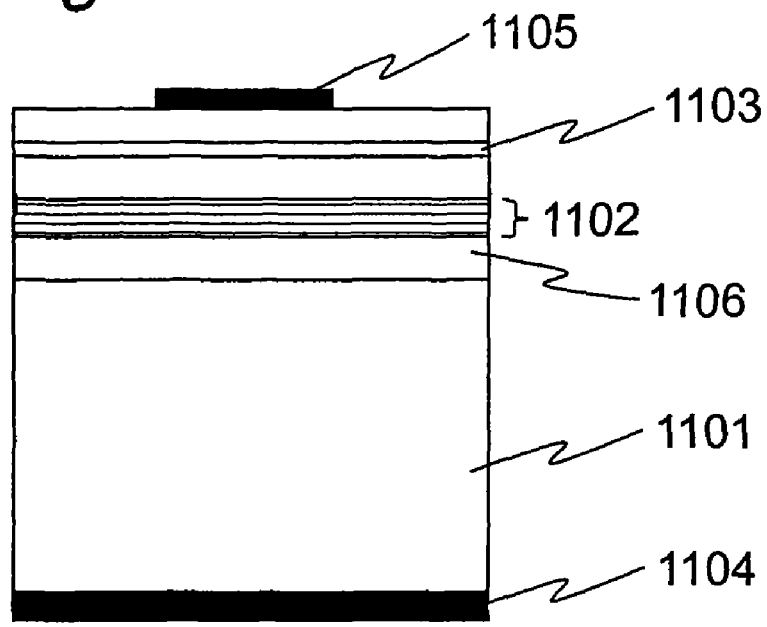
FIG. 11 is a schematic cross-sectional view of a light-emitting device according to an embodiment of the present invention.

FIG. 11 is a schematic cross-sectional view of an example of a semiconductor light-emitting device in which the supporting substrate is joined to the first reflecting layer through metal. In FIG. 11, the reference numeral 1101 denotes the supporting substrate, 1102 is a DBR layer as the first reflecting layer, 1103 denotes a luminous layer, 1104 denotes an electrode, 1105 denotes an electrode, and 1106 denotes a joining metal as an example of the metal.

The DBR layer 1102 is composed of two or more semiconductor epitaxial layers. Furthermore, the layer between the DBR layer 1102 and the luminous layer 1103 and the layer on the luminous layer 1103 are also composed of semiconductor epitaxial layers.

The joining metal 1106 is provided for the purpose of ensuring the electrical joint and securely reflecting light which has entered the DBR layer 1102 obliquely and passed through the DBR layer 1102.

Furthermore, since the supporting substrate 1102 and the DBR layer 1102 are joined through the joining metal 1106, the supporting substrate 1101 can be joined to the DBR layer 1102 at a relatively low temperature (e.g. a temperature in the neighborhood of 400 degrees centigrade) in the manufacturing process.

Thus, phenomena affecting the reliability of the device, such as diffusion phenomenon, alloying, and dislocation growth in the semiconductor layers which would occur at high temperature processing, can be suppressed.

In addition, the joining metal 1106 is not limited to a single layer structure, and may be of a multi-layer structure. Furthermore, the joining metal 1106 may be made in a given shape, for example, patterning as shown in FIG. 6A or 6B may be performed, provided that a sufficient joint strength can be ensured.

Figure 12:
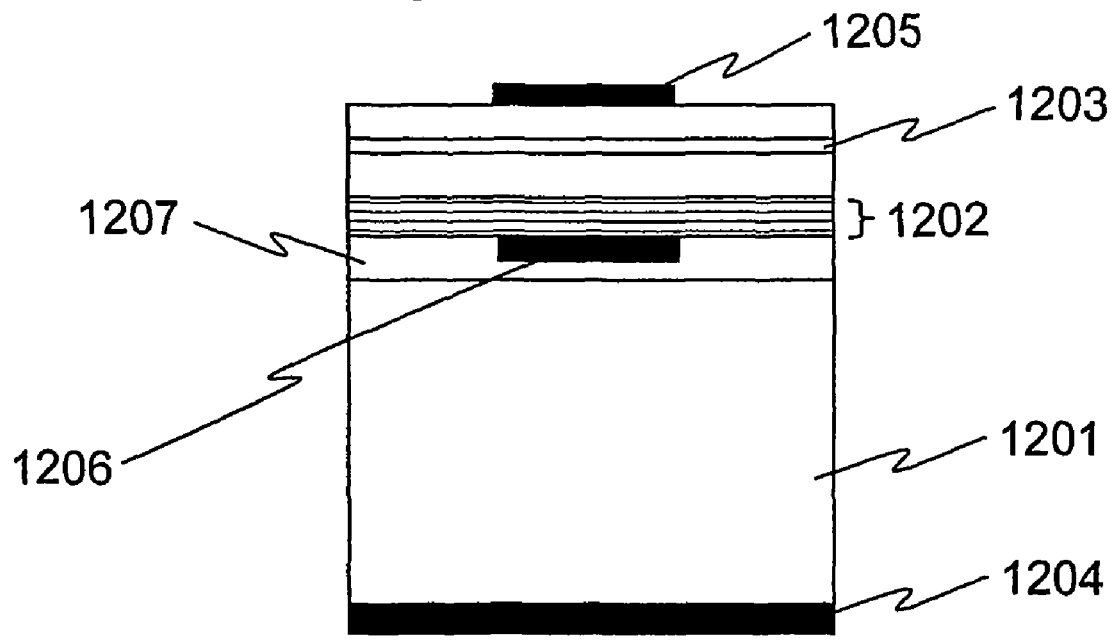
FIG. 12 is a schematic cross-sectional view of a light-emitting device according to an embodiment of the present invention.

FIG. 12 is a schematic cross-sectional view of a semiconductor light-emitting device in which the metal is composed of a metal for ensuring the electrical conductivity of a joint between the supporting substrate and the first reflecting layer, and a metal for surely providing reflectivity for the emission wavelength of the luminous layer, i.e., for surly reflecting light of the emission wavelength of the luminous layer. In FIG. 12, the reference numeral 1201 denotes the supporting substrate, 1202 denotes a DBR layer, 1203 denotes the luminous layer, 1204 denotes an electrode, 1205 denotes an electrode, 1206 denotes a joining metal, and 1207 denotes a metallic reflecting layer. The joining metal 1206 is an example of the metal for ensuring the electrical conductivity of a joint between the supporting substrate and the first reflecting layer. The metallic reflecting layer 1207 is an example of the metal for surely providing the reflectivity for the emission wavelength of the luminous layer.

The DBR layer 1202 is composed of two or more semiconductor epitaxial layers. Furthermore, the layer between the DBR layer 1202 and the luminous layer 1203 and the layer on the luminous layer 1203 are also composed of semiconductor epitaxial layers.

As described above, the DBR layer 1202 is most effective in reflecting light vertically incident on it.

Thus, even if there is an alloy layer serving as a light-absorbing layer in a position (joint position) on the DBR layer 1202 where light vertically enters, there would be no loss of light caused by light absorption of the light-absorbing layer.

As described above, metallic material allowing electrical connection is used only in the above position, and metal for reflection is provided on the joint surface excepting the position, so that the electrical characteristic and optical characteristic of the semiconductor light-emitting device can be more improved.

Figure 13:
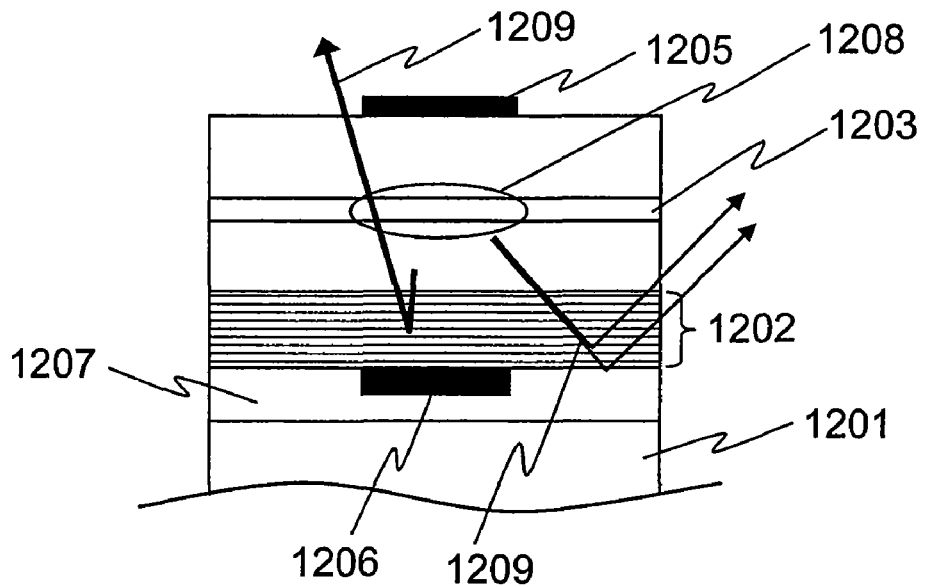
FIG. 13 shows the manner in which outgoing light is reflected in the light-emitting device of FIG. 12.

In more detail, as shown in FIG. 13, of light emitted from the luminous area 1208, light going in a direction substantially perpendicular to the surface of the supporting substrate 1201 is reflected by the joining metal 1206. Furthermore, light going in a direction oblique to the surface of the supporting substrate 1201 of the emitted light is reflected by the metallic reflecting layer 1207. In FIG. 13, the reference numeral 1209 denotes loci of light emitted from the luminous area 1208.

More specific embodiments of the present invention will be described in detail below.

Embodiment 1

Figure 14:
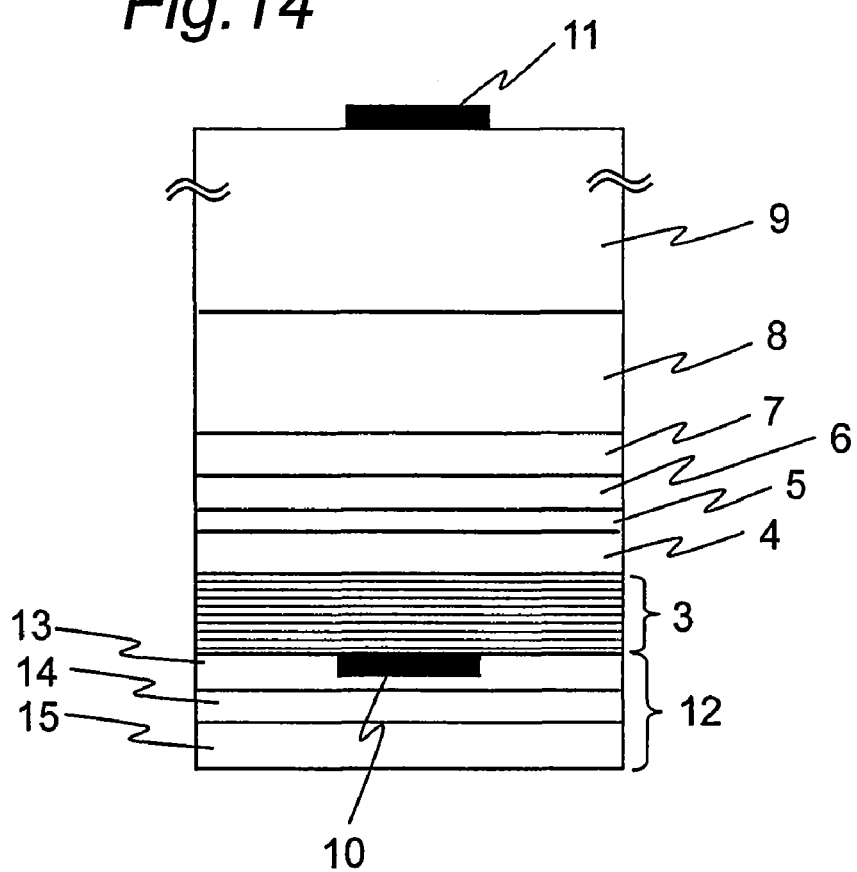
FIG. 14 is a schematic cross-sectional view of a light-emitting device according to Embodiment 1 of the present invention.

FIG. 14 is a schematic cross-sectional view of a semiconductor light-emitting device according to Embodiment 1 of the present invention.

The semiconductor light-emitting device includes an n-type DBR layer 3, an n-type $Al_{0.5}In_{0.5}P$ cladding layer 4, a 4-element AlGaInP active layer 5, a p-type $Al_{0.5}In_{0.5}P$ cladding layer 6, a p-type GaInP intermediate layer 7, a p-type GaP contact layer 8, a p-type GaP transparent substrate 9, ohmic electrodes 10 and 11, and a reflecting layer 12.

The n-type DBR layer 3 is composed of 20 pairs of an n-type AlAs light reflection layer and an n-type $Al_{0.61}Ga_{0.39}As$ light reflection layer. Furthermore, the n-type DBR layer 3 is able to reflect light of the emission wavelength of the AlGaInP active layer 6.

The AlGaInP active layer 5 emits red light. Furthermore, the AlGaInP active layer 5 has a quantum well structure. In more detail, the AlGaInP active layer 5 is formed by stacking $(Al_{0.05}Ga_{0.95})_{0.5}In_{0.5}P$ well layers and $(Al_{0.50}Ga_{0.50})_{0.5}In_{0.5}P$ barrier layers alternately. The number of pairs of the well layer and the barrier layer is twenty.

The p-type GaP transparent substrate 9 is pervious to the emission wavelength of the AlGaInP active layer 5.

The ohmic electrode 10 is formed so as to cover part of the under surface of the n-type DBR layer 3 in FIG. 14. The ohmic electrode 10 is composed of an AuSi layer and an Au layer. Furthermore, the under surface of the ohmic electrode 10 in FIG. 14 is covered with an Au layer 13. It is desirable that the ohmic electrode 10 is shaped like a dot or dots as shown in FIG. 6A or 6B.

The ohmic electrode 11 is formed so as to cover part of the upper surface of the p-type GaP transparent substrate 9 in FIG. 14. The ohmic electrode 11 is composed of an AuBe layer and an Au layer.

The reflecting layer 12 is composed of an Au layer 13, a Mo layer 14, and an AuSn layer 15. The Au layer 13 is provided to reflect light which has passed through the n-type DBR layer 3. The Mo layer 14 is provided to prevent the Au layer 13 and the AuSu layer 15 from being alloyed with each other. The AuSn layer 15 is provided to be eutectically bonded to a die bond surface.

In Embodiment 1, the n-type DBR layer 3 is an example of the first reflecting layer, the n-type $Al_{0.5}In_{0.5}P$ cladding layer 4 is an example of the first semiconductor layer, the AlGaInP active layer 5 is an example of the luminous layer, the p-type $Al_{0.5}In_{0.5}P$ cladding layer 6 is an example of the second semiconductor layer, the p-type GaInP intermediate layer 7 is an example of the second semiconductor layer, the p-type GaP contact layer 8 is an example of the second semiconductor layer, the p-type GaP transparent substrate 9 is an example of the transmissive substrate, the ohmic electrode 10 is an example of the electrode for reflecting layer use, the ohmic electrode 11 is an example of the electrode for transmissive substrate use, and the reflecting layer 12 is an example of the second reflecting layer.

In the semiconductor light-emitting device as configured above, although the ohmic electrode 10 is formed underneath the n-type DBR layer 3, light emitted by the AlGaInP active layer 5 is reflected by the n-type DBR layer 3 before being absorbed by the ohmic electrode 10, so that the light extraction efficiency can be prevented from reducing.

Thus, the light extraction efficiency of the semiconductor light-emitting device can be increased.

Furthermore, since the p-type GaP transparent substrate 9 which is pervious to the emission wavelength of the AlGaInp active layer 5 is mounted on the p-type GaP contact layer 8, light emitted by the AlGaInP active layer 5 can be extracted efficiently through the p-type GaP transparent substrate 9.

Furthermore, although the ohmic electrode 11 is formed on the p-type GaP transparent substrate 9, it covers only part of the upper surface of the p-type GaP transparent substrate 9 in FIG. 14, so that a decreased amount of light components of the light emitted from the AlGaInP active layer 5 can enter the ohmic electrode 11.

Furthermore, since the p-type GaP transparent substrate 9 is mounted on the p-type GaP contact layer 8, the distance between a die bond surface for die-bonding the semiconductor light-emitting device and the AlGaInP active layer 5 can be reduced.

Thus, heat generated near the AlGaInP active layer is radiated or released efficiently to the die bond surface, and thereby the reliability of the semiconductor light-emitting device can be increased.

A method of manufacturing a semiconductor light-emitting device will be described below with reference to FIGS.

Figure 15A:
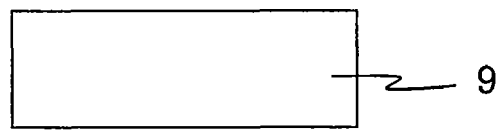
FIG. 15A shows a step in a process of manufacturing the semiconductor light-emitting device of Embodiment 1.
Figure 15A:

15A to 15E. In this manufacturing method, an n-type GaAs substrate 1 and a p-type GaP transparent substrate 9 shown in FIG. 15A are used.

Figure 15B:
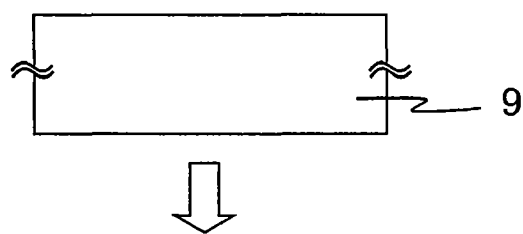
FIG. 15B shows a step in the process of manufacturing the semiconductor light-emitting device of Embodiment 1.
Figure 15B:
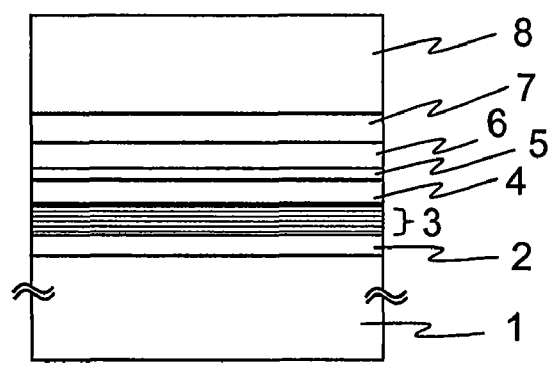

At first, as shown in FIG. 15B, an n-type GaAs buffer layer 2, an n-type DBR layer 3, an n-type $Al_{0.5}In_{0.5}P$ cladding layer 4, an AlGaInP active layer 5, a p-type $Al_{0.5}In_{0.5}P$ cladding layer 6, a p-type GaInP intermediate layer 7, and a p-type GaP contact layer 8 are stacked in this order on the n-type GaAs substrate 1 by a MOCVD method to form an epitaxial wafer having an LED structure.

The thicknesses of the substrates and the layers are 250 μm of the n-type GaAs substrate 1, 1.0 μm of the n-type GaAs buffer layer 2, 2.0 μm of the n-type DBR layer 3, 1.0 μm of the n-type $Al_{0.5}In_{0.5}P$ cladding layer 4, 0.5 μm of the AlGaInP active layer 5, 1.0 μm of the p-type $Al_{0.5}In_{0.5}P$ cladding layer 6, 1.0 μm of the p-type GaInP intermediate layer 7, and 4.0 μm of the p-type GaP contact layer 8.

When the epitaxial wafer is formed, Si is used as n-type dopant, while Zn is used as p-type dopant. As a matter of course, dopant for forming the epitaxial wafer is not limited to Si and Zn. For example, Te or Se may be used as n-type dopant, while Mg or carbon may be used as p-type dopant.

The carrier concentrations of the substrates and the layers are $1.0 \times 10^{18}$ cm$^{-3}$ of the n-type GaAs substrate 1, $5 \times 10^{17}$ cm$^{-3}$ of the n-type GaAs buffer layer 2, $5 \times 10^{17}$ cm$^{-3}$ of the n-type DBR layer 3, $5 \times 10^{17}$ cm$^{-3}$ of the n-type $Al_{0.5}In_{0.5}P$ cladding layer 4, 0 cm$^{-3}$ (non-doped) of the AlGaInP active layer 5, $5 \times 10^{17}$ cm$^{-3}$ of the p-type $Al_{0.5}In_{0.5}P$ cladding layer 6, $1.0 \times 10^{18}$ cm$^{-3}$ of the p-type GaInP intermediate layer 7, and $2.0 \times 10^{18}$ cm$^{-3}$ of the p-type GaP contact layer 8.

Next, the p-type GaP transparent substrate 9 is placed on the epitaxial surface of the epitaxial wafer. In other words, the p-type GaP transparent substrate 9 is mounted directly on the upper surface of the p-type GaP contact layer 8 in FIG. 15B.

Figure 15C:
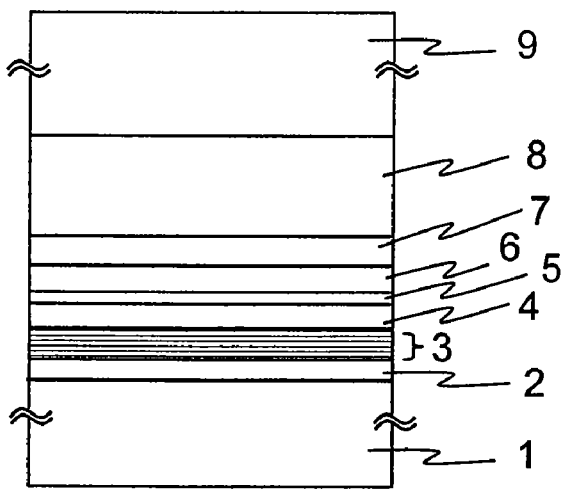
FIG. 15C shows a step in the process of manufacturing the semiconductor light-emitting device of Embodiment 1.

Next, a compressive force is applied to the contact surface between the epitaxial wafer and the p-type GaP transparent substrate 9, and the contact surface is heated for about 30 minutes in an atmosphere of hydrogen at the neighborhood of 800 degrees centigrade. As a result, the p-type GaP transparent substrate 9 is joined to the epitaxial wafer as shown in FIG. 15C. The heating is performed after the epitaxial wafer and the p-type GaP transparent substrate 9 have been put in a heating furnace.

The carrier concentration of the p-type GaP transparent substrate 9 is $5.0 \times 10^{17}$ cm$^{-3}$ in the embodiment, but is not limited to $5.0 \times 10^{17}$ cm$^{-3}$, and may be any in a range where electrical continuity is achievable.

Figure 15D:
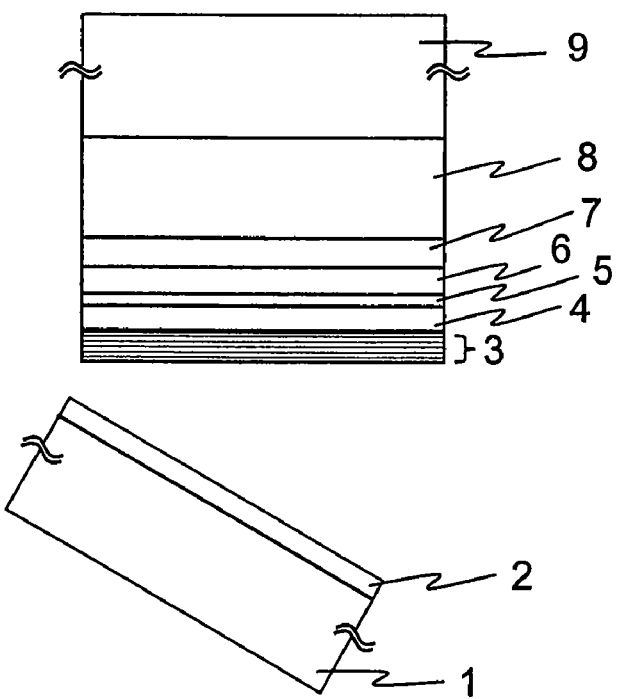
FIG. 15D shows a step in the process of manufacturing the semiconductor light-emitting device of Embodiment 1.

Next, the epitaxial wafer is cooled, and is then taken out from the heating furnace. After that, the n-type GaAs substrate 1 and the n-type GaAs buffer layer 2 are dissolved away, as shown in FIG. 15D, with the mixture of ammonia water, hydrogen peroxide, and water. As a result, the under surface of the n-type DBR layer 3 in FIG. 15D is exposed. Because the n-type DBR layer 3 has a high Al mole fraction, this layer 3 also functions as an etching stop layer.

If it is desired that the etching by the mixture be more surely stopped, an AlGaAs layer, for example, may be formed between the n-type GaAs buffer layer 2 and the n-type DBR layer 3.

Figure 15E:
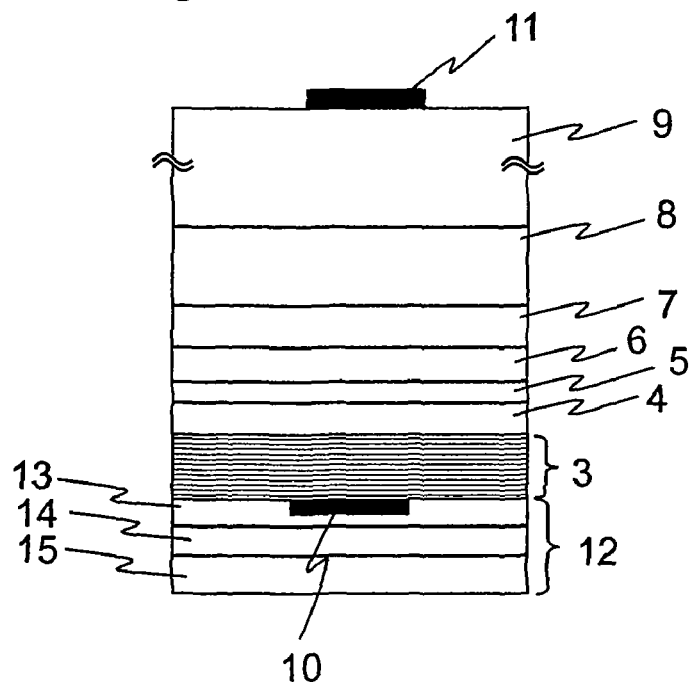
FIG. 15E shows a step in the process of manufacturing the semiconductor light-emitting device of Embodiment 1.

Next, as shown in FIG. 15E, an ohmic electrode 10 is formed on the exposed surface of the n-type DBR layer 3 (one surface of an n-type AlAs light reflection layer or of an n-type $Al_{0.61}Ga_{0.39}As$ light reflection layer), and an ohmic electrode 11 is formed on the upper surface of the p-type GaP transparent substrate 9 in FIG. 15E.

AuSi/Au is selected as the material of the ohmic electrode 10, while AuBe/Au is selected as the material of the ohmic electrode 11, and then these materials are worked into optional shapes by photolithography method and wet etching.

After that, in order to enhance the effect of reflecting light emitted by the AlGaInP active layer 5, a reflecting layer 12 composed of a multi-layer film of an Au layer, a Mo layer and an AuSn layer is formed on the surface on which the ohmic electrode 10 is formed, that is, on the exposed surface of the DBR layer 3. The reflecting layer 12 serves as a reflecting layer composed of tow or more layers, and an electrode for bonding.

Next, half-dicing is performed on the epitaxial wafer, on which the ohmic electrodes 10 and 11 and the reflecting layer 12 are formed, to facilitate the division of the epitaxial wafer into chips having a predetermined size.

The half-dicing can be performed with various materials and techniques. For example, wet etching or dry etching may be used. However, dry etching may be more suitable for the half-dicing than wet etching in that it is compatible with any material to divide. Materials and techniques for the half-dicing are not limited to those of Embodiment 1.

Finally, the half-diced epitaxial wafer is divided into chips having a predetermined size, and a plurality of semiconductor light-emitting devices are thus obtained. These semiconductor light-emitting devices are high luminance red light-emitting devices having the emission wavelength of 640 nm.

The manufacturing process described above may be applied to not only light-emitting diodes having an AlGaInP 4-element luminous layer but also semiconductor light-emitting devices the luminous layers of which are made of other semiconductor crystal.

In Embodiment 1, the ohmic electrode 10 is formed so as to cover part of the under surface of the n-type DBR layer 3 in FIG. 14, but may be formed so as to cover the whole of the under surface of the n-type DBR layer 3 in FIG. 14.

In Embodiment 1, the reflecting layer 12 which covers the under surface of the ohmic electrode 10 in FIG. 14 is used. However, a reflecting layer which does not cover the under surface of the ohmic electrode 10 in FIG. 14 may be used. When this reflecting layer is formed, the under surface of the ohmic electrode 10 in FIG. 14 is exposed. One surface of the reflecting layer may be made flush with the under surface of the ohmic electrode 10 in FIG. 14.

In Embodiment 1, the reflecting layer 12 composed of the Au layer 13, the Mo layer 14, and the AuSn layer 15 is used. However, a reflecting layer composed of only the Au layer 13 may be used.

In Embodiment 1, the reflecting layer 12 is composed of the Au layer 13, the Mo layer 14, and the AuSn layer 15, but may be composed of one or more layers made of at least one or more elements of Au, Ag, Al, Ti, Cu, Mo, Sn, W, Ta, Pt, Ge, Si, Zn, Be, Cr, Se, and Ni.

In Embodiment 1, a semiconductor layer including at least two or more elements of Ga, Si, P, C, Zn, Se, Cd, Te, B, N, Al, In, Hg, S, and O may be used instead of the p-type GaP transparent substrate 9, provided that the semiconductor layer is pervious to the emission wavelength of the luminous layer of the semiconductor light-emitting device.

In Embodiment 1, the conductivity types of the substrates and the layers may be reversed. In this case, the semiconductor light-emitting device is manufactured using not the n-type GaAs substrate 1 but a p-type GaAs substrate.

Embodiment 2

Embodiment 2 is different from Embodiment 1 in that in Embodiment 2 a supporting substrate is attached to the DBR layer through a metal.

Figure 16:
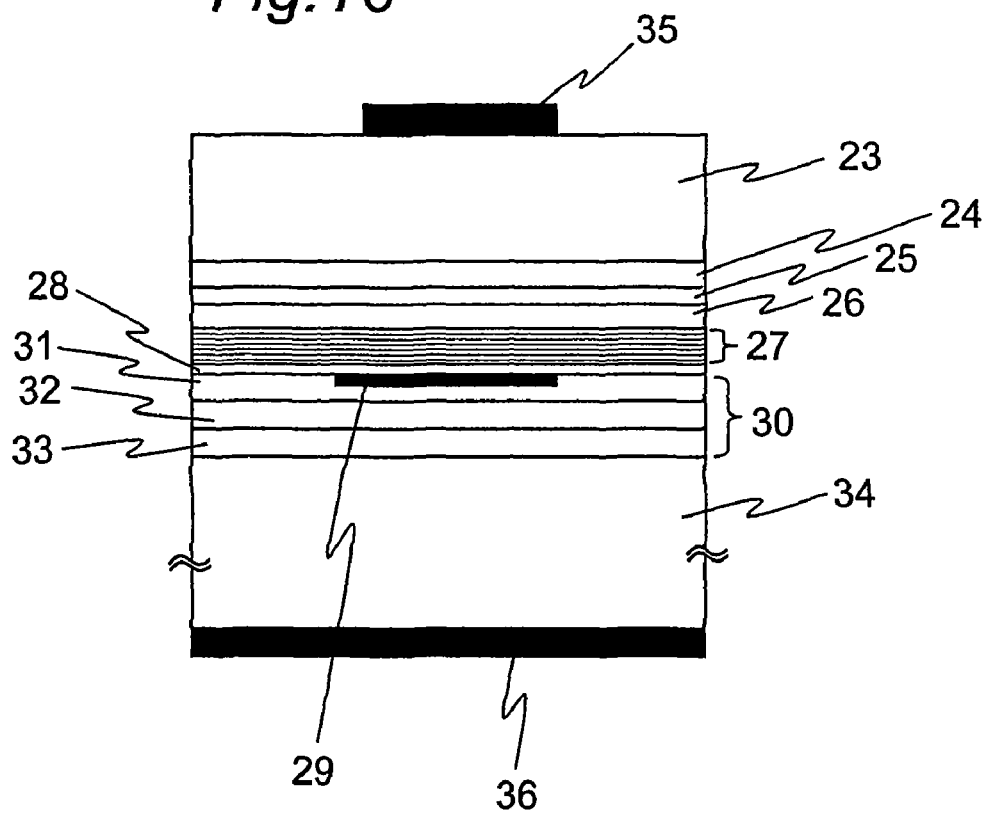
FIG. 16 is a schematic cross-sectional view of a light-emitting device according to Embodiment 2 of the present invention.

FIG. 16 is a schematic cross-sectional view of the semiconductor light-emitting device of Embodiment 2 of the present invention.

The semiconductor light-emitting device includes an n-type $Al_{0.6}Ga_{0.4}As$ current diffusion layer 23, an n-type $Al_{0.5}In_{0.5}P$ cladding layer 24, an AlGaInP active layer 25, a p-type $Al_{0.5}In_{0.5}P$ cladding layer 26, a p-type DBR layer 27, a p-type AlGaAs contact layer 28, ohmic electrodes 29, 35 and 36, a reflecting layer 30, and a p-type Si substrate 34.

The AlGaInP active layer 25 emits red light. Furthermore, the AlGaInP active layer 25 has a quantum well structure. In more detail, the AlGaInP active layer 25 is formed by stacking $(Al_{0.05}Ga_{0.95})_{0.5}In_{0.5}P$ well layers and $(Al_{0.50}Ga_{0.50})_{0.5}In_{0.5}P$ barrier layers alternately. The number of pairs of the well layer and the barrier layer is twenty.

The p-type DBR layer 27 is composed of 20 pairs of a p-type AlAs light reflection layer and a p-type $Al_{0.61}Ga_{0.39}As$ light reflection layer. Furthermore, the p-type DBR layer 27 is able to reflect the emission wavelength of the AlGaInP active layer 25.

The ohmic electrode 29 is formed so as to cover part of the under surface of the p-type AlGaAs contact layer 28 in FIG. 16. The ohmic electrode 29 is composed of an AuBe layer and an Au layer. Furthermore, the under surface of the ohmic electrode 29 in FIG. 16 is covered with an Au layer 31.

The reflecting layer 30 is composed of an Au layer 31, a Mo layer 32, and an Au layer 33. Light which has passed through the p-type DBR layer 27 can be reflected by the Au layer 31.

In Embodiment 2, the n-type $Al_{0.6}Ga_{0.4}As$ current diffusion layer 23 is an example of the second semiconductor layer, the n-type $Al_{0.5}In_{0.5}P$ cladding layer 24 is an example of the second semiconductor layer, the AlGaInP active layer 25 is an example of the luminous layer, the p-type $Al_{0.5}In_{0.5}P$ cladding layer 26 is an example of the first semiconductor layer, the p-type DBR layer 27 is an example of the first reflecting layer, the p-type AlGaAs contact layer 28 and the ohmic electrode 29 are an example of the metal with which the supporting substrate is joined to the first reflecting layer, the reflecting layer 30 is an example of the metal with which the supporting substrate is joined to the first reflecting layer, and the p-type Si substrate 34 is an example of the supporting substrate.

In the semiconductor light-emitting device as configured above, although the ohmic electrode 29 is formed underneath the p-type DBR layer 27, light emitted by the AlGaInP active layer 25 is reflected by the p-type DBR layer 27 before absorbed by the ohmic electrode 29, so that the light extraction efficiency can be prevented from reducing.

Thus, the light extraction efficiency of the semiconductor light-emitting device can be increased.

Figure 17A:
FIG. 17A shows a step in a process of manufacturing the semiconductor light-emitting device of Embodiment 2.
Figure 17A:

A method of manufacturing the semiconductor light-emitting device will be described below with reference to FIGS. 17A to 17E. In this manufacturing method, an n-type GaAs substrate 21 and a p-type Si substrate 34 shown in FIG. 17A are used.

Figure 17B:
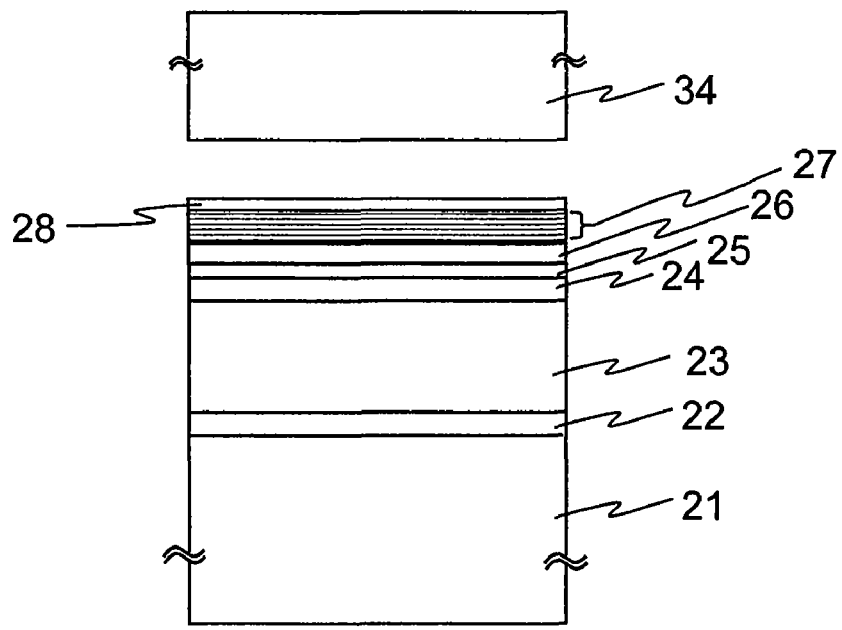
FIG. 17B shows a step in the process of manufacturing the semiconductor light-emitting device of Embodiment 2.

At first, as shown in FIG. 17B, an n-type GaAs buffer layer 22, an n-type $Al_{0.6}Ga_{0.4}As$ current diffusion layer 23, an n-type $Al_{0.5}In_{0.5}P$ cladding layer 24, an AlGaInP active layer 25, a p-type $Al_{0.5}In_{0.5}P$ cladding layer 26, a p-type DBR layer 27, and a p-type AlGaAs contact layer 28 are stacked in this order on the n-type GaAs substrate 21 by a MOCVD method to form an epitaxial wafer having an LED structure.

The thicknesses of the substrates and the layers are 250 µm of the n-type GaAs substrate 21, 1.0 µm of the n-type GaAs buffer layer 22, 5.0 µm of the n-type $Al_{0.6}Ga_{0.4}As$ current diffusion layer 23, 1.0 µm of the n-type $Al_{0.5}In_{0.5}P$ cladding layer 24, 0.5 µm of the AlGaInP active layer 25, 1.0 µm of the p-type $Al_{0.5}In_{0.5}P$ cladding layer 26, 2.0 µm of the p-type DBR layer 27, and 1.0 µm of the p-type AlGaAs contact layer 28.

When the epitaxial wafer is formed, Si is used as n-type dopant, while Zn is used as p-type dopant. As a matter of course, dopant for forming the epitaxial wafer is not limited to Si and Zn. For example, Te or Se may be used as n-type dopant, while Mg or carbon may be used as p-type dopant.

The carrier concentrations of the substrates and the layers are $1.0 \times 10^{18}$ cm$^{-3}$ of the n-type GaAs substrate 21, $5 \times 10^{17}$ cm$^{-3}$ of the n-type GaAs buffer layer 22, $1.0 \times 10^{18}$ cm$^{-3}$ of the n-type $Al_{0.6}Ga_{0.4}As$ current diffusion layer 23, $5 \times 10^{17}$ cm$^{-3}$ of the n-type $Al_{0.5}In_{0.5}P$ cladding layer 24, 0 cm$^{-3}$ (non-doped) of the AlGaInP active layer 25, $5 \times 10^{17}$ cm$^{-3}$ of the p-type $Al_{0.5}In_{0.5}P$ cladding layer 26, $5 \times 10^{17}$ cm$^{-3}$ of the p-type DBR layer 27, and $5.0 \times 10^{17}$ cm$^{-3}$ of the p-type AlGaAs contact layer 28.

Figure 17C:
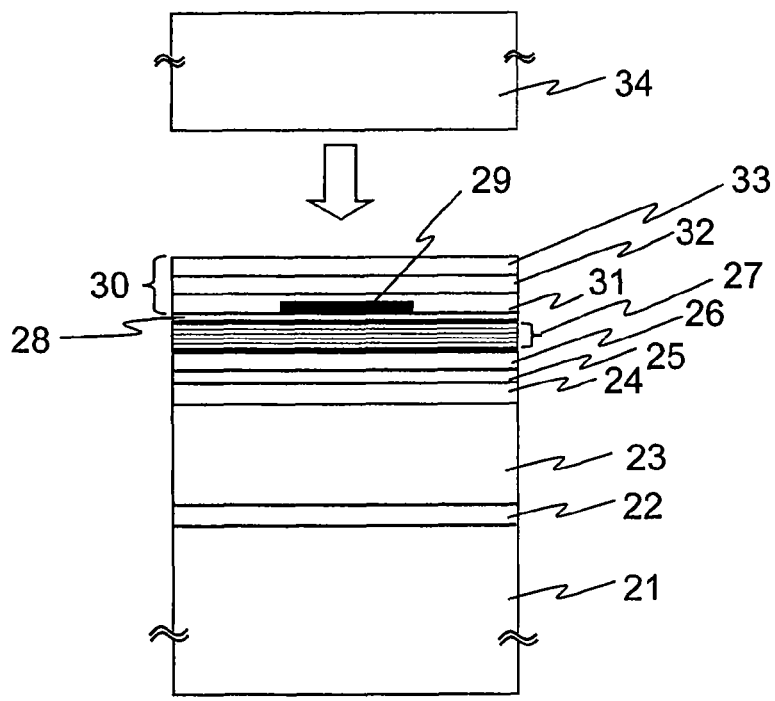
FIG. 17C shows a step in the process of manufacturing the semiconductor light-emitting device of Embodiment 2.

Next, as shown in FIG. 17C, an ohmic electrode 29 is formed on part of the epitaxial surface of the epitaxial wafer. In other words, the ohmic electrode 29 is formed on part of the upper surface of the p-type AlGaAs contact layer 28 in FIG. 17B.

AuSi/Au is selected as the material of the ohmic electrode 29, and then this material is worked into a desired shape by photolithography method and wet etching.

Next, an Au layer 31, an Mo layer 32, and an Au layer 33 are stacked in this order on the p-type AlGaAs contact layer 28 and the ohmic electrode 29 to form a reflecting layer 30.

Next, the p-type Si substrate 34 is placed on the upper surface of the reflecting layer 30 in FIG. 17C. In other words, the p-type Si substrate 34 is mounted directly on the upper surface of the Au layer 33 in FIG. 17C.

Figure 17D:
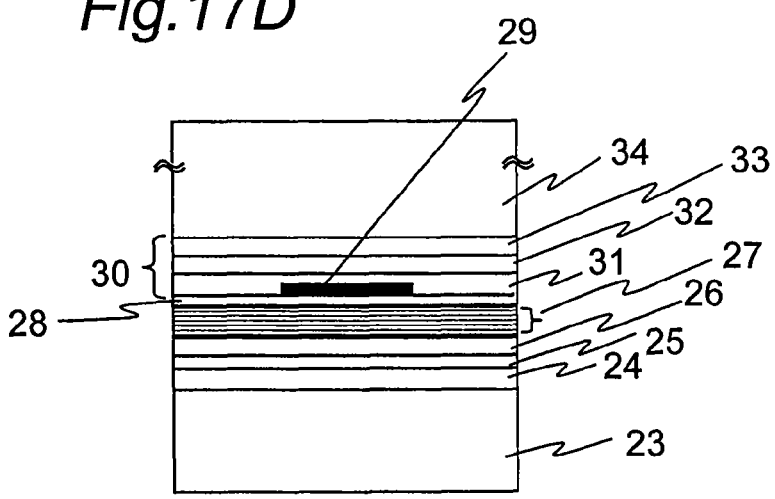
FIG. 17D shows a step in the process of manufacturing the semiconductor light-emitting device of Embodiment 2.
Figure 17D:
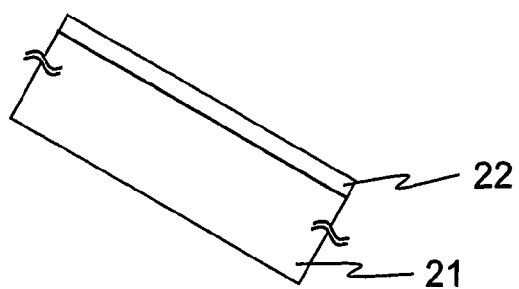

Next, a compressive force is applied to the contact surface between the epitaxial wafer and the p-type Si substrate 34, and the contact surface is heated for about 30 minutes in an atmosphere of hydrogen at the neighborhood of 450 degrees centigrade. As a result, the p-type Si substrate 34 is joined to the epitaxial wafer as shown in FIG. 17D. The heating is performed with the epitaxial wafer and the p-type Si substrate 34 put in a heating furnace.

The carrier concentration of the p-type Si substrate 34 is but not limited to $5.0 \times 10^{17}$ cm$^{-3}$, and may be in a range where electrical continuity is possible. Furthermore, when a substrate is joined to the reflecting layer through metal, the conductivity type of the substrate may be either p-type or n-type.

Next, the epitaxial wafer is cooled, and is then taken out from the heating furnace. After that, the n-type GaAs substrate 21 and the n-type GaAs buffer layer 22 are dissolved away with the mixture of ammonia water, hydrogen peroxide, and water. As a result, one surface of the n-type $Al_{0.6}Ga_{0.4}As$ current diffusion layer 23 is exposed.

Figure 17E:
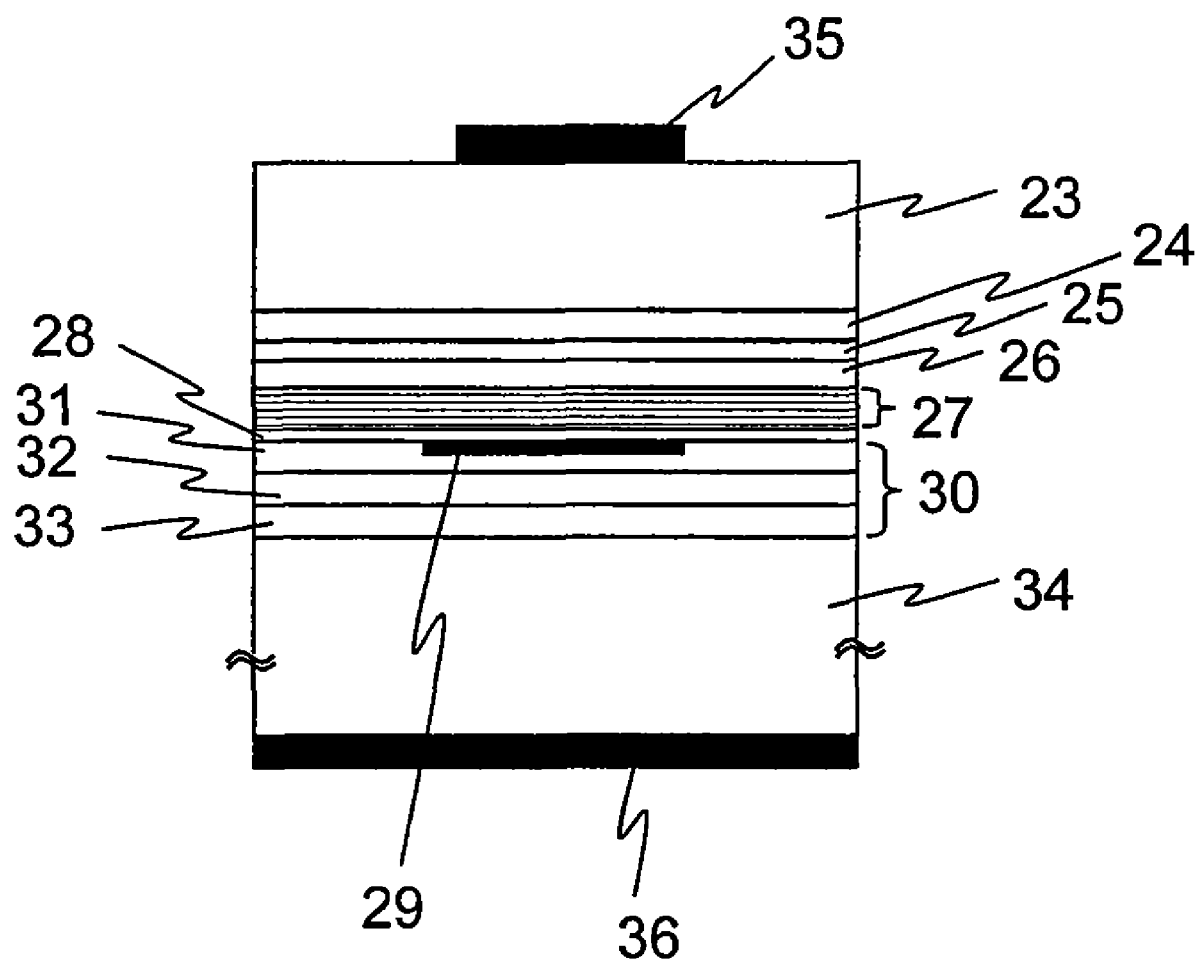
FIG. 17E shows a step in the process of manufacturing the semiconductor light-emitting device of Embodiment 2.

Next, as shown in FIG. 17E, an ohmic electrode 35 is formed on the under surface of the n-type $Al_{0.6}Ga_{0.4}As$ current diffusion layer 23 in FIG. 17E, and an ohmic electrode 36 is formed on the whole of the under surface of the p-type Si substrate 34 in FIG. 17E. There is an upside-down relation between FIG. 17E and FIG. 17D.

Next, the epitaxial wafer on which the ohmic electrodes 35 and 36 and the reflecting layer 30 are formed is half-diced for dividing the epitaxial wafer into chips having a predetermined size.

The half-dicing can be performed for every material using every technique. For example, wet etching or dray etching may be used. However, dry etching is assumed to be more suitable for the half-dicing than wet etching in that the wet etching it compatible with any material to divide. Materials and techniques for the half-dicing are not limited to those of Embodiment 2.

Finally, the half-diced epitaxial wafer is divided into chips having a predetermined size, and a plurality of semiconductor light-emitting devices can be thus obtained. These semiconductor light-emitting devices are high-luminance red light-emitting devices having the emission wavelength of 640 nm.

The manufacturing process described above may be applied to not only light-emitting diodes having an AlGaInP 4-element luminous layer but also semiconductor light-emitting devices the luminous layers of which are made of semiconductor crystal.

In Embodiment 2, the reflecting layer 30 composed of the Au layer 31, the Mo layer 32, and the Au layer 33 is used. However, a reflecting layer composed of one or more layers made of at least one or more elements of Au, Ag, Al, Ti, Cu, Mo, Sn, W, Ta, Pt, Ge, Si, Zn, Be, Cr, Se, and Ni may be used provided that the reflecting layer surely reflects the emission wavelength of the AlGaInP active layer 25. For example, a reflecting layer composed of only the Au layer 31 may be used instead of the reflecting layer 30 composed of the Au layer 31, the Mo layer 32, and the Au layer 33.

In Embodiment 2, the ohmic electrode 29 composed of an AuBe layer and an Au layer is used. However, an ohmic electrode composed of one or more layers made of at least one or more elements of Au, Ag, Al, Ti, Cu, Mo, Sn, W, Ta, Pt, Ge, Si, Zn, Be, Cr, Se, and Ni may be used provided that the ohmic electrode ensures the electrical conductivity to the p-type DBR layer 27.

In Embodiment 2, the p-type Si substrate 34 is used. However, a substrate made of material including at least one or more elements of Au, Ag, Al, Ti, Cu, Mo, Sn, W, Ta, Pt, Ge, Si, Ga, Zn, Be, Cr, Se, and Ni may be used.

In Embodiment 2, the conductivity types of the substrates and the layers may be reversed. In this case, the semiconductor light-emitting device is manufactured using not the n-type GaAs substrate 21 but a p-type GaAs substrate.

Embodiment 1 and Embodiment 2 may be combined appropriately according to the present invention.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light-emitting device, comprising:
a first conductivity type first semiconductor layer;
a luminous layer formed on the first semiconductor layer;
a second conductivity type second semiconductor layer formed on the luminous layer;
a transmissive substrate which is mounted on and joined to the second semiconductor layer and is pervious to the emission wavelength of the luminous layer; and
a first reflecting layer which is formed under the first semiconductor layer and composed of stacked two or more first conductivity type semiconductor layers, and at least part of which has reflectivity for an emission wavelength of the luminous layer,
wherein an electrode for reflecting layer use is formed on part of a surface of the first reflecting layer opposite from the first semiconductor layer, and
wherein a second reflecting layer which has reflectivity for the emission wavelength of the luminous layer is formed on the surface of the first reflecting layer opposite from the first semiconductor layer, in an area other than an area where the electrode for reflecting layer use is formed.

2. A semiconductor light-emitting device as claimed in claim 1, wherein the second reflecting layer is formed so as to cover the first reflecting layer and the electrode for reflecting layer use.

3. A semiconductor light-emitting device as claimed in claim 1, wherein the second reflecting layer is composed of one or more layers made of at least one or more elements of Au, Ag, Al, Ti, Cu, Mo, Sn, W, Ta, Pt, Ge, Si, Zn, Be, Cr, Se, and Ni.

4. A semiconductor light-emitting device as claimed in claim 1, wherein the transmissive substrate comprises a semiconductor layer including at least two or more elements of Ga, Si, P, C, Zn, Se, Cd, Te, B, N, Al, In, Hg, S, and O.

* * * * *